United States Patent [19]

Lane

[11] Patent Number: 4,465,550

[45] Date of Patent: Aug. 14, 1984

[54] METHOD AND APPARATUS FOR SLICING SEMICONDUCTOR INGOTS

[75] Inventor: Richard L. Lane, Penfield, N.Y.

[73] Assignee: General Signal Corporation, Stamford, Conn.

[21] Appl. No.: 568,936

[22] Filed: Jan. 10, 1984

Related U.S. Application Data

[63] Continuation of Ser. No. 388,876, Jun. 16, 1982, abandoned.

[51] Int. Cl.$^3$ .................. H01L 21/306; B44C 1/22; C03C 15/00; C03C 25/06
[52] U.S. Cl. .................. 156/635; 156/345; 156/645; 156/654; 156/662
[58] Field of Search ............. 156/635, 636, 637, 638, 156/645, 345, 654, 662; 252/79.5

[56] References Cited

U.S. PATENT DOCUMENTS

| | | | |
|---|---|---|---|
| 2,809,103 | 10/1957 | Alexander | 252/79.5 X |
| 3,421,956 | 1/1969 | Ebert et al. | 252/79.1 X |
| 3,915,770 | 10/1975 | Santillo | 156/345 X |
| 3,971,683 | 7/1976 | Briska et al. | 252/79.2 X |
| 4,343,662 | 8/1982 | Gay | 156/345 X |

OTHER PUBLICATIONS

Ind. Lab. (USA), vol. 38, No. 4, Apr. 1972, Machine for Deformation-Free Cutting of Metals, V. I. Babenko et al., pp. 604 and 605.

Indian J. Technol., vol. 12, No. 1, Jan. 1974, An Apparatus for Cutting Metallic Single Crystals, Anand, pp. 40–42.

Primary Examiner—William A. Powell
Attorney, Agent, or Firm—Pollock, Vande Sande & Priddy

[57] ABSTRACT

A method and apparatus for slicing solid materials, such as silicon, germanium, glass, ceramics, gallium arsenide, etc. by reactive chemicals which are carried to the workpiece by a travelling flexible member such as a wire or cable. More particularly, the invention relates to a method and apparatus for slicing ingots of the above-mentioned substances into wafers for use in the fabrication of integrated circuit, solar cells and the like. The reactive chemical preferably is a molten salt which reacts with the semiconductive material, and the flexible member is preferably electrically conductive and heated by passing a current through such member to ensure that the salt is reactive only at the location of contact of such flexible member with the ingot being sliced.

9 Claims, 1 Drawing Figure

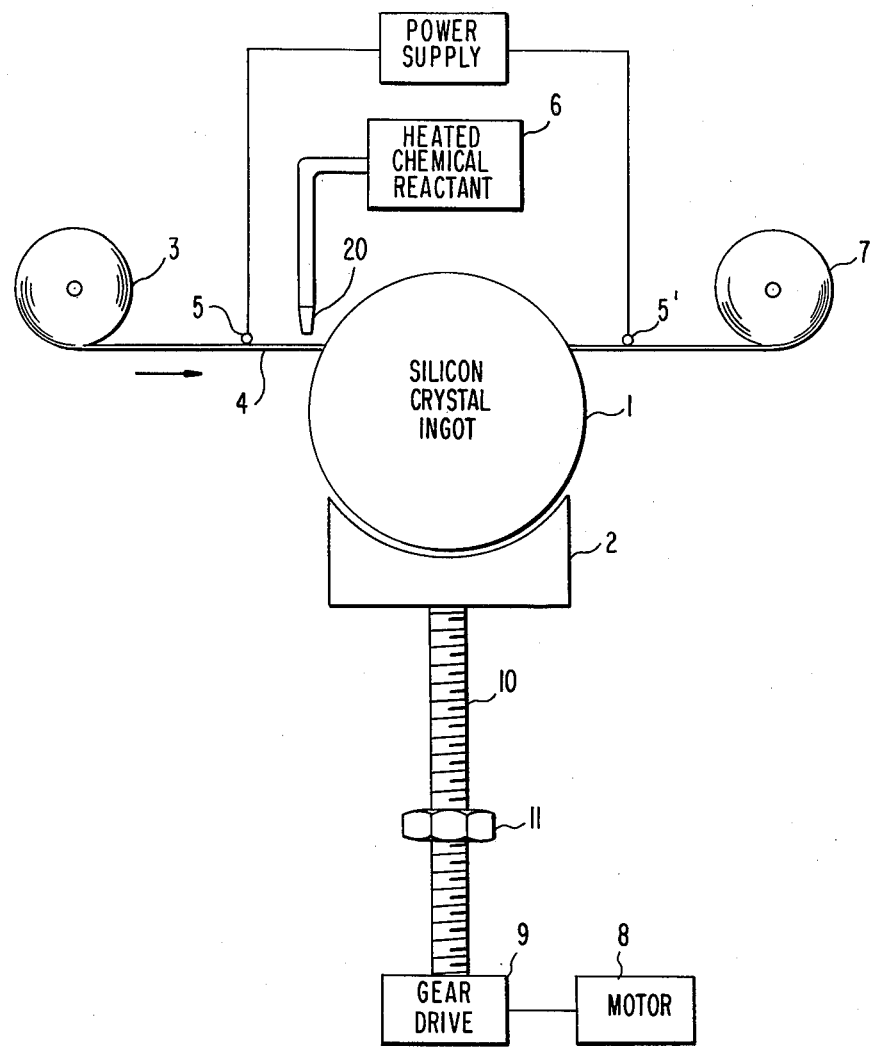

METHOD AND APPARATUS FOR SLICING SEMICONDUCTOR INGOTS

This application is a continuation of application Ser. No. 388,876, filed June 16, 1982, now abandoned.

BACKGROUND OF THE INVENTION

In the fabrication of integrated circuits, it is common to grow a large single crystal of a material such as silicon in the form of an elongated cylindrical ingot, and later to slice the ingot into a plurality of thin wafers. The presently known techniques for slicing of wafers are not fully satisfactory in that a long time is required to slice a single wafer from the ingot, most of the slicing techniques result in the formation of a kerf of considerable width thereby resulting in material wastage, and also the known techniques often provide a quite rough surface on the wafers so that additional extensive polishing is required. For these reasons, it is recognized in the art that improved techniques for the slicing of wafers from ingots are highly desired.

Brief Description of the Prior Art

The present invention relates to a method and apparatus for the cutting of solid materials, such as silicon, germanium, glass, ceramic material, Gallium arsenide or other solid materials which dissolve or react to molten salts. A reactive chemical, such as molten sodium hydroxide is carried to the desired portion of the workpiece by means of a travelling flexible member, preferably a wire or cable. Rapid dissolution of the desired area of the workpiece is achieved as the heated molten salt reacts with the workpiece ingot.

To cut an ingot into a wafer using a hot etchant heated by a wire is a known process as disclosed in U.S. Pat. No. 3,915,770 to Santillo. Also known is the employment of boiling aqueous solutions of sodium hydroxide to etch silicon, such a process having been disclosed in U.S. Pat. Nos. 3,041,226 (Pennington) and 3,486,892 (Rosvold).

The use of a melt of sodium peroxide and sodium nitride at temperatures of 400°-600° C. to etch the surface of silicon carbide is taught by U.S. Pat. No. 3,421,956 issued to Ebert et al., while the electro-deplating of silicon in an acid is described in U.S. Pat. No. 2,998,362 granted to Hall.

Other prior art patents relevant to the present invention are U.S. Pat. No. 3,689,389 (Waggener) which teaches the prevention of etching of silicon in a sodium hydroxide solution by electro-chemical means and U.S. Pat. Nos. 3,078,219 (Chang) and 3,184,399 (Schnable et al), both of which teach the use of sodium hydroxide or potassium hydroxide as the electrolyte in the electrolytic cutting of silicon by using a jet spray. U.S. Pat. No. 3,130,138 (Faust et al) teaches the use of sodium hydroxide or potassium hydroxide as the electrolyte between a rotating disc and a tungsten ingot.

Some of the prior art methods and apparatus are able to successfully cut the workpiece into the desired wafer only by exacting a high kerf loss during the cutting process, thereby wasting expensive semiconductor material. Others inflict substantial sub-surface damage to the workpiece itself or necessitate a thorough polishing of the workpiece subsequent to the cutting.

Those prior art techniques which effect the slicing of wafers by direct contact between the cutting member and the portion of the workpiece to be cut not only exacerbate the kerf-loss problem discussed above but also possess the disadvantage that the cutting member is continually subject to stress, wear, and subsequent breakage because of the mechanical abrasion they require to perform the cutting process. Another problem with the known techniques and apparatuses employed in ingot cutting is that most are sensitive to the type of dopant employed in the semiconductor in that certain dopants result in etch pits appearing in the surface of the workpiece and/or wide variations in the cutting rates, persumably due to the difficulty experienced in the passing of electric current through the semiconductor itself. Finally, most of the prior art methods and apparatuses have the additional and significant drawback that they often require at least ten to thirty hours to complete the cutting of a single wafer.

Referring to the above-mentioned Santillo patent, this discloses a method of wafer slicing in which an acid etching solution is applied to the periphery of a rotating etchant application wheel from which the etchant is propelled outwardly against a crystal boule. The etchant is heated by a wire which is energized by an electrical current. Relative motion is effected between the boule on the one hand and the wheel and wire, on the other hand, either by reciprocating the boule or by movement of the wheel and wire. In contrast, according to the present invention, the reactive fluid is carried to the cutting area of the ingot by the wire itself which is continually moved relative to the ingot while the wire is electrically heated to raise the temperature of the salt to a predetermined value.

Summary of the Invention

An object of the present invention is to provide a method and an apparatus which will significantly lessen the amount of time required to cut a solid material such as a silicon ingot.

Another object of the present invention is to provide a method and an apparatus for cutting a solid material such as a silicon ingot which will minimize the kerf loss sustained during the cutting process.

A further object of the present invention is to provide a method and an apparatus for cutting solid material such as a silicon ingot which will minimize or eliminate the sub-surface damage sustained by the workpiece during the cutting process.

Another object of the present invention is to provide a method and an apparatus for the cutting of a solid material such as a silicon ingot which will require little polishing of the workpiece.

Another object of the present invention is to provide a method and apparatus for the cutting of a solid material such as a silicon ingot which will eliminate or mitigate the problems of stress, breakage and wear of the cutting member.

These and other objects and advantages of this invention will appear more fully upon consideration of the illustrative embodiment now to be described in detail in connection with the accompanying drawing.

BRIEF DESCRIPTION OF THE DRAWING

The accompanying drawing shows an illustrative embodiment of an apparatus made according to the present invention.

DETAILED DESCRIPTION OF THE PREFERRED EMBODIMENT

Referring now to an illustrative embodiment of the invention as shown in the drawing, an apparatus and method for cutting various molten salt reactive solid materials comprises a workpiece 1 coprising an ingot held by a workholder or cradle 2. A reel 3 contains a continuous length of an electrically conductive wire or cable 4. In operation of the equipment, the wire is wound onto a takeup reel 7, passing as it does so into contact with the ingot 1. In the region of contact of wire 4 with ingot 1, the wire is heated by an electric current applied via electrical contactors 5 and 5' from power supply 8. Simultaneously, a reactive chemical such as, but not limited to, molten sodium hydroxide, which has been heated in reservoir 6 to at least the melting point of the salt employed, coats wire 4, being applied thereto by nozzle 20 at a location such that the wire is wetted with the molten salt as it contacts the ingot.

A chemical reaction occurs between the molten salt coated wire 4 and silicon crystal workpiece 1 whereby a localized dissolution of the workpiece 1 occurs. Experimentation has shown that the cutting of the workpiece is effected by such a chemical reaction and not by a process of abrasion or actual contact between the wire 4 and the workpiece 1 since the resulting kerf is found to be of somewhat greater width than the diameter of the wire. This permits fast cutting of the workpiece 1 with little stress or wear on wire 4 and little or no kerf damage to ingot 1.

During this execution of the process, motion of wire 4 is produced by the winding of wire from reel 3 and to takeup reel 7. Preferably wire 4 is not in the form of an endless loop; thus, once all of the wire has moved from supply reel 3 to takeup reel 7, the wire 4 can be reversed from reel 7 back to reel 4. Conveniently, wire 4 may have imparted thereto an oscillating motion superimposed upon its translational motion as described above.

The continuation of the cutting process just described is assured by the constant and controlled movement of cradle 2, containing workpiece 1, toward wire 4. Such vertical movement of cradle 2 and ingot 1 is achieved by motor 8 acting through gear drive 9 to rotate a threaded screw 10 which is in threaded engagement with stationary nut 11 to provide a constant movement of ingot 1 toward the cutting member 4.

The flexible member 4 may comprise a braided or twisted cable in order that the heated molten salt may be more easily carried into the internal surfaces and voids of the workpiece 1. Similarly, the cutting member 4 may also comprise a wire with embedded hard, inert particles or a knurled or a roughened wire, either of which would facilitate transporting a hot molten salt into the surface depressions of the workpiece. In yet another embodiment of the present invention, inert insoluble particles may be suspended in a liquid hot molten salt which then act to separate the wire 4 from direct contact with the workpiece and thereby allow a space between the wire 4 and the workpiece 1 for the liquid molten salt to enter.

It should be understood that dissolution of the workpiece in areas where it is not desired can be minimized by maintaining the ingot itself at a temperature below the reactive temperature of the salt being employed as the chemical reactant in the region where the slicing operation is taking place. The heated wire is maintained at a sufficiently high temperature to ensure that the chemical reactant can be effective witin the kerf to produce dissolution of the crystalline material.

It is also within the scope of the invention to employ an eutectic mixture of salts rather than a single salt. A characteristic of such a mixture is that its melting temperature is quite low and with a rate of reaction which is at or near zero when the temperature of the molten mixture is only slightly above its melting temperature. By use of a heated wire it becomes possible to elevate the temperature of the mixture locally at the desired cutting point to a level at which the mixture reacts with the material of the workpiece. This permits the use of a salt which remains molten during use but which becomes effective to perform a cutting operation only where heated locally, thereby facilitating the transport of the salt mixture to the cutting groove and also facilitating the removal of the spent products from such groove.

While the forms of the invention herein disclosed constitute preferred embodiments, it is not intended herein to describe all of the possible equivalent forms or manifestations of this invention. It will be understood that the words used are words of description rather than of limitation, and that various changes may be made without departing from the spirit or scope of the invention.

What is claimed is:

1. A method of slicing a crystalline ingot to form thin wafers therefrom comprising the steps of:

moving a flexible metallic wire in relation to a kerf formed in said ingot during the slicing operation, depositing on said metallic wire a molten salt or mixture of salts capable of chemically reacting with the crystalline material to dissolve said material, and maintaining the temperature of the molten salt at least outside of the kerf below that at which molten salt reacts with the crystalline material of which the ingot is formed, heating said metallic wire to a sufficiently high temperature to ensure that said molten salt is chemically reactive in said kerf with said crystalline material, whereby said molten salt is conveyed to the kerf of the ingot by said flexible member and effects cutting of said ingot.

2. A method of slicing a crystal ingot in accordance with claim 1, wherein said flexible member is heated by passing an electrical current therethrough.

3. The method of claims 1 or 2 in which an oscillating movement along the direction of movement of said member is superimposed upon a translational movement thereof.

4. Apparatus for slicing crystal ingots into wafers, said apparatus comprising:

means for moving a metallic wire in contact with said ingot in a direction substantially at right angles to the axis of the ingot, means for continuously coating said flexible member with a molten salt capable of reacting with and dissolving the material of said ingot;

means for heating said metallic wire to a sufficiently high temperature to ensure that the molten salt will react with the material of the ingot within the kerf during the cutting operation but not so high as to cause the molten salt to react with the ingot material outside of the kerf, and means for continuously moving said ingot and said flexible member toward each other.

5. Apparatus in accordance with claim 4 wherein said flexible member is multistranded.

6. Apparatus in accordance with claim 4 wherein said flexible member contains fixed insoluble particles.

7. Apparatus in accordance with claim 4 wherein said molten salt contains inert solid and insoluble particles.

8. The apparatus of claim 4 in which said flexible member has a rough outer surface.

9. The apparatus of claim 4 in which said flexible member is knurled.

* * * * *